(12) United States Patent
Hendriks et al.

(10) Patent No.: US 10,903,762 B2
(45) Date of Patent: Jan. 26, 2021

(54) ACTUATOR DEVICE BASED ON AN ELECTROACTIVE OR PHOTOACTIVE POLYMER

(71) Applicant: KONINKLIJKE PHILIPS N.V., Eindhoven (NL)

(72) Inventors: Cornelis Petrus Hendriks, Eindhoven (NL); Mark Thomas Johnson, Eindhoven (NL); Daan Anton Van Den Ende, Eindhoven (NL); Eduard Gerard Marie Pelssers, Eindhoven (NL); Roland Alexander Van De Molengraaf, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 419 days.

(21) Appl. No.: 15/755,245

(22) PCT Filed: Sep. 2, 2016

(86) PCT No.: PCT/EP2016/070713
§ 371 (c)(1),
(2) Date: Feb. 26, 2018

(87) PCT Pub. No.: WO2017/037230
PCT Pub. Date: Mar. 9, 2017

(65) Prior Publication Data
US 2018/0248497 A1    Aug. 30, 2018

(30) Foreign Application Priority Data
Sep. 2, 2015 (EP) ...................... 15183464

(51) Int. Cl.
*H01L 41/193* (2006.01)
*H02N 2/06* (2006.01)
(Continued)

(52) U.S. Cl.
CPC ............... *H02N 2/06* (2013.01); *F03G 7/005* (2013.01); *H01L 41/083* (2013.01);
(Continued)

(58) Field of Classification Search
CPC .......... H02N 2/06; H02N 2/10; H01L 41/083; H01L 41/193; F03G 7/00
See application file for complete search history.

(56) References Cited

U.S. PATENT DOCUMENTS 4,725,994 A * 2/1988 Kaneko ................ B06B 1/0692
310/334
4,945,275 A    7/1990 Honda
(Continued)

FOREIGN PATENT DOCUMENTS

EP    0301430 A2    2/1989
JP    S63-289975 A    11/1988
(Continued)

*Primary Examiner* — J. San Martin
(74) *Attorney, Agent, or Firm* — Schott, P.C.

(57) ABSTRACT

An actuator device comprises an electroactive or photoactive polymer arrangement having an effective length over which expansion or contraction is induced by actuation. The effective length is greater than the maximum linear physical dimension of the space occupied by the polymer arrangement. In this way, a compact design is provided which can support a large actuation displacement.

20 Claims, 2 Drawing Sheets

(51) Int. Cl.
  *F03G 7/00* (2006.01)
  *H01L 41/083* (2006.01)
  *H02N 2/10* (2006.01)
  *H02N 11/00* (2006.01)
  *H02N 2/02* (2006.01)

(52) U.S. Cl.
  CPC ........ H01L 41/0836 (2013.01); H01L 41/193 (2013.01); H02N 2/02 (2013.01); H02N 2/10 (2013.01); H02N 11/006 (2013.01)

(56) References Cited

U.S. PATENT DOCUMENTS

| | | | |
|---|---|---|---|
| 5,440,194 A | 8/1995 | Beurrier | |
| 5,757,090 A * | 5/1998 | Kirjavainen | H04R 19/00 29/592.1 |
| 6,107,726 A | 8/2000 | Near et al. | |
| 6,597,086 B1 * | 7/2003 | Boecking | H01L 41/0472 310/328 |
| 8,093,783 B2 * | 1/2012 | Rosenthal | F01L 9/04 310/328 |
| 8,143,764 B2 * | 3/2012 | Nagamitsu | F03G 7/005 310/328 |
| 8,414,632 B2 | 4/2013 | Kornkven et al. | |
| 9,371,823 B2 * | 6/2016 | Hongo | F03G 7/005 |
| 2005/0073218 A1 * | 4/2005 | Topliss | H01L 41/0953 310/328 |
| 2005/0085693 A1 | 4/2005 | Belson et al. | |
| 2007/0257582 A1 * | 11/2007 | Yokoyama | H02N 1/002 310/300 |
| 2010/0118405 A1 | 5/2010 | Allison et al. | |
| 2011/0053241 A1 | 3/2011 | Den Tooner et al. | |
| 2012/0080980 A1 | 4/2012 | Kaal et al. | |
| 2014/0139329 A1 | 5/2014 | Ramstein et al. | |
| 2015/0008798 A1 * | 1/2015 | Kato | H01L 41/27 310/339 |
| 2016/0301330 A1 * | 10/2016 | Van Kessel | H02N 2/181 |

FOREIGN PATENT DOCUMENTS

| | | |
|---|---|---|
| JP | 1193827 A | 4/1999 |
| JP | 2006125396 A | 5/2006 |
| JP | 2010-226949 A | 10/2010 |
| WO | 2007029275 A1 | 3/2007 |
| WO | 2011/036861 A1 | 3/2011 |

* cited by examiner

ACTUATOR DEVICE BASED ON AN ELECTROACTIVE OR PHOTOACTIVE POLYMER

CROSS-REFERENCE TO PRIOR APPLICATIONS

This application is the U.S. National Phase application under 35 U.S.C. § 371 of International Application No. PCT/EP2016/070713, filed on Sep. 2, 2016, which claims the benefit of EP Patent Application No. EP 15183464.5, filed on Sep. 2, 2015. These applications are hereby incorporated by reference herein.

FIELD OF THE INVENTION

This invention relates to actuator devices which make use of electroactive or photoactive polymers.

BACKGROUND OF THE INVENTION

Electroactive polymers (EAPs) and photoactive polymers can be used to apply a force to a load, or to apply a displacement to a non-loaded surface, based on an electrical or light stimulus.

Electroactive polymers (EAP) in particular are an emerging class of materials within the field of electrically responsive materials. EAP's can work as sensors or actuators and can easily be manufactured into various shapes allowing easy integration into a large variety of systems.

This invention is in particular concerned with actuator designs.

Materials have been developed with characteristics such as actuation stress and strain which have improved significantly over the last ten years. Technology risks have been reduced to acceptable levels for product development so that EAPs are commercially and technically becoming of increasing interest. Advantages of EAPs include low power, small form factor, flexibility, noiseless operation, accuracy, the possibility of high resolution, fast response times, and cyclic actuation.

The improved performance and particular advantages of EAP material give rise to applicability to new applications.

An EAP device can be used in any application in which a small amount of movement of a component or feature is desired, based on electric actuation.

The use of EAPs enables functions which were not possible before, or offers a big advantage over common actuator solutions, due to the combination of a relatively large deformation and force in a small volume or thin form factor, compared to common actuators. EAPs also give noiseless operation, accurate electronic control, fast response, and a large range of possible actuation frequencies, such as 0-20 kHz.

Devices using electroactive polymers can be subdivided into field-driven and ionic-driven materials.

Examples of field-driven EAPs are dielectric elastomers, electrostrictive polymers (such as PVDF based relaxor polymers or polyurethanes) and liquid crystal elastomers (LCE).

Examples of ionic-driven EAPs are conjugated polymers, carbon nanotube (CNT) polymer composites and Ionic Polymer Metal Composites (IPMC).

Field-driven EAP's are actuated by an electric field through direct electromechanical coupling, while the actuation mechanism for ionic EAP's involves the diffusion of ions. Both classes have multiple family members, each having their own advantages and disadvantages.

FIGS. 1 and 2 show two possible operating modes for an EAP device.

The device comprises an electroactive polymer layer 14 sandwiched between electrodes 10, 12 on opposite sides of the electroactive polymer layer 14.

FIG. 1 shows a device which is not clamped. A voltage is used to cause the electroactive polymer layer to expand in all directions as shown.

FIG. 2 shows a device which is designed so that the expansion arises only in one direction. The device is supported by a carrier layer 16. A voltage is used to cause the electroactive polymer layer to curve or bow.

The nature of this movement for example arises from the interaction between the active layer which expands when actuated, and the passive carrier layer. To obtain the asymmetric curving around an axis as shown, molecular orientation (film stretching) may for example be applied, forcing the movement in one direction.

The expansion in one direction may result from the asymmetry in the EAP polymer, or it may result from asymmetry in the properties of the carrier layer, or a combination of both.

The expansion and consequent movement or change in shape of the EAP device is in many cases used to deliver an actuation force to an external component. However, the stroke of movement is also important in some applications. Basic mechanical approaches can be applied to increase a longitudinal tip displacement of an EAP actuator. For example, an increased stroke is possible by connecting multiple actuators in series, or by increasing the length L of a single actuator. The displacement of the tip of the actuator is given by the product of the actuation strain and the original length.

In both cases the penalty is an increased total length of the actuator. A problem arises when a large tip displacement is needed in combination with volume restrictions.

SUMMARY OF THE INVENTION

It is an object of the invention to at least partly solve the aforementioned problem. This object is achieved with the invention as defined by the independent claims. The dependent claims provide advantageous embodiments.

According to examples in accordance with an aspect of the invention, there is provided an actuator device comprising:

an electroactive or photoactive polymer arrangement comprising a stack of at least two overlapping polymer units connected by an intermediate layer, with one of the at least two overlapping polymer units connected to one end of the intermediate layer, and the other of the at least two overlapping polymer units connected to an opposite end of the intermediate layer, wherein the intermediate layer comprises a further electroactive or photoactive polymer unit, such that the stack comprises a top, a middle and a bottom electroactive or photoactive polymer unit; and a drive unit, wherein the drive unit is operable in at least first, second and third modes, wherein:

in the first mode, the top and bottom polymer units are driven off and the middle electroactive polymer unit is driven on;

in the second mode, the top and bottom polymer units are driven on and the middle electroactive polymer unit is driven off; and in the third mode, the top, middle and bottom polymer units are all driven off, and wherein in third mode, the three polymer units have the same length.

The invention enables an EAP or photoactive polymer actuator to provide a displacement which is larger than is achieved with a single linear device or a series string of such devices. In particular, an effective length of the actuator device (i.e. the length which would be required for a single linear actuator to deliver the same displacement) is larger than the physical size of the device. The displacement may for example be larger than the actuator external dimension (length) multiplied by the actuation strain. This allows the development of small form factor actuators.

The term "polymer arrangement" and "polymer unit" is used below to indicate generally a photoactive or electroactive polymer arrangement or unit, respectively.

The meaning of the term "effective length" used in this context will now be explained more fully. If a polymer unit changes in length by x % based on a given actuation signal (electrical or light), then the "effective length" Le can be derived as $Le=y/(x/100)$ when there is an actual observed change in length of y for the same given actuation signal:

Thus, Le is the original length which would give rise to the observed absolute change in length y based on the properties of the material, in particular the percentage change in length x expected for a given actuation signal. Le can be considered to be the length of a single actuator device which would be required to provide the observed absolute length change y.

For a single linear actuator of real length Lr, the change in length will be $y=Lr(x/100)$. In this case, $Le=Lr$.

For two actuators each of length Lr and end-to-end in series, the observed change in length will be $y=2Lr(x/100)$. In this case $Le=2Lr$. If the two actuators are simply connected end-to-end in this way, then the physical length will also be 2Lr and there is no space saving achieved.

The invention provides designs in which the physical length is smaller than the effective length Le, and thereby the effective length is greater than the maximum physical linear dimension of the arrangement. For example, a stacking arrangement may enable the physical length to be kept at Lr (i.e. the length of one unit that makes up the overall arrangement) but the stacking design gives a greater change in length than a single unit.

Note that the "effective length" is not simply the sum of all lengths of individual units. For example, with multiple units simply in parallel, the effective length is simply the length of one such unit, since the range of movement is not increased by such a configuration. Instead, the force is increased. With individual units in series, the effective length is indeed the sum of the lengths of the individual units, but the physical length of those units is the same.

Preferably, the effective length is at least 50% larger than the maximum linear physical dimension, for example at least double, and even more preferably three or more times the maximum linear dimension.

The polymer arrangement comprises a stack of at least two overlapping polymer units connected by an intermediate layer, with one of the at least two overlapping polymer units connected to one end of the intermediate layer, and the other of the at least two overlapping polymer units connected to an opposite end of the intermediate layer.

This defines a zig-zag structure, with a staggered overlapped pair of polymer units. If the two polymer units expand or contract, the overall expansion or contraction combines the individual expansion or contraction of the two units, as is the case for a linear string of units, but their overlap reduces the size of the device.

The intermediate layer comprises another electroactive or photoactive polymer unit, such that the stack comprises a top, a middle, and a bottom electroactive or photoactive polymer unit. By having a three-layer stack, the middle unit can be in its short mode when the top and bottom units are in their long mode.

For this purpose the device comprises a drive unit, wherein the drive unit is operable in the at least three modes In the third mode, the three polymer units have the same length. Thus, they have the same inherent lengths (i.e. when all are turned off). This simplifies the manufacture of the device.

The device may comprise a fixed end at the end of the other of the overlapping polymer units which is not connected to the intermediate layer and a free end at the end of the one of the overlapping polymer units which is not connected to the intermediate layer.

The free end may thus have a rest position in the third mode, and it is displaced in one direction in the first mode and it is displaced in an opposite direction in the second mode.

In this way, the actuation is to both sides of the device. Thus, the first and second modes provide actuation to opposite sides with respect to the rest position of the third mode of operation.

The layers of the stack may comprise a single folded layer, with segmented electrodes to define the different actuatable polymer units.

The polymer units are preferably planar in these designs, and the effective length is along a direction within the plane. A clamp arrangement may be provided for clamping the stack in the stacking direction to prevent bucking.

Incremental tip displacement may for example be enabled by using a simple on-off driving scheme.

In one set of examples, all of the polymer units are electroactive polymers. However, the same approach may be applied to photoactive polymers as well.

BRIEF DESCRIPTION OF THE DRAWINGS

Examples of the invention will now be described in detail with reference to the accompanying drawings, in which.

DETAILED DESCRIPTION OF THE EMBODIMENTS

The invention provides an actuator device comprising an electroactive or photoactive polymer arrangement having an effective length over which expansion or contraction is induced by actuation. The effective length is greater than the maximum linear physical dimension of the space occupied by the electroactive or photoactive polymer arrangement. In this way, a compact design is provided which can support a large actuation displacement.

The detailed description below is based on various EAP actuator designs, but the same approaches apply equally to photoactive polymer designs.

Figure 1:
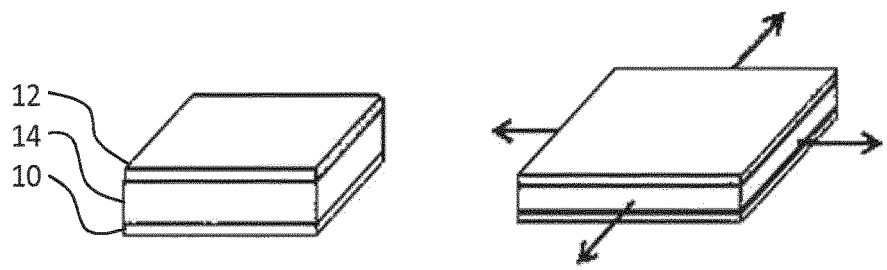
FIG. 1 shows a known electroactive polymer device which is not clamped.
Figure 2:
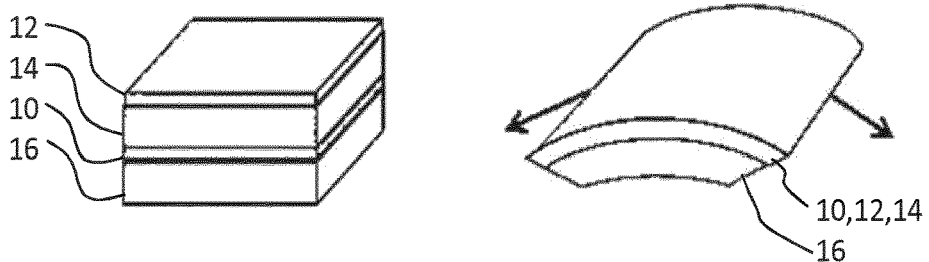
FIG. 2 shows a known electroactive polymer device which is constrained by a backing layer.
Figure 3:
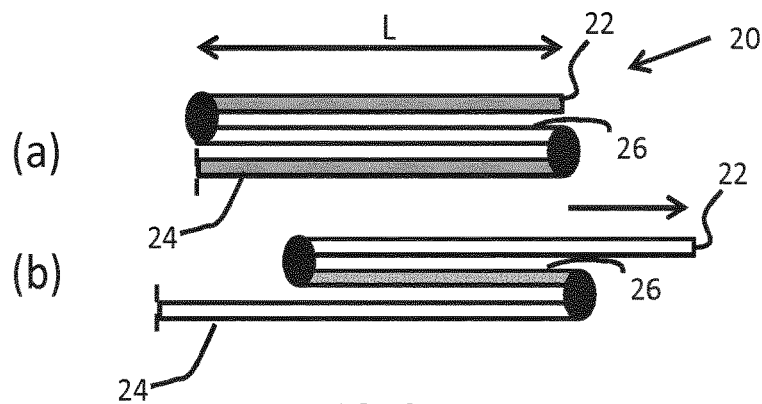
FIG. 3 shows a first example of EAP actuator device in two different modes.

FIG. 3 shows a first possible example of EAP actuator device, which does not fall within the scope of the invention, in two different modes.

The device comprises an electroactive polymer arrangement 20 which comprises a stack of two overlapping electroactive polymer units 22, 24 connected by an intermediate layer 26. The end of the top electroactive polymer unit is connected to a first end (the left end in FIG. 3) of the intermediate layer 26, and the bottom electroactive polymer unit 34 is connected to an opposite end (the right end in FIG. 3) of the intermediate layer 26.

This defines a zig-zag structure, with a staggered overlapped pair of electroactive polymer units. The actuator is fixed at one end, such as the left end of the bottom actuator 24 as shown in FIG. 3.

The actuator has an effective length which contributes to the overall expansion or contraction which is at least the combination of the lengths of the two electroactive polymer units 22, 24. This is thus greater than the maximum linear physical dimension of the space occupied by the electroactive polymer arrangement.

This physical dimension is typically simply the length between end points. The maximum physical dimension may be taken to be that which is present when all EAP units are turned off (which will equate to the length L shown in FIG. 3) or it may be taken to be the greatest length which arises as between all actuation states. In this latter case, the maximum physical dimension for the example of FIG. 3 is the overall length in FIG. 3(b).

As explained above, the "effective length" Le may be considered to be the original length (of a single linear actuator) which would give rise to an observed absolute change in length for a given actuation signal.

For a series connection of actuator devices, the effective length will be equal to the sum of the lengths which contribute in a series manner to the overall displacement, which lengths are measured when the device is in a non-actuated mode. Thus, for the example of FIG. 3, the effective length is the sum of the lengths of the two EAP units in their at-rest positions in FIG. 3(a), or the sum of all three units in FIG. 3(a) if they are all electroactive polymer units (these different options are discussed below). The effective length is the lengths in the non-actuated mode which contribute in a combinatory way to the expansion or contraction when actuated.

Indeed, in the example of FIG. 3, the intermediate layer 26 may also be an electroactive polymer unit, such that the stack comprises a top, a middle, and a bottom electroactive polymer unit. By having a three-layer stack, the middle unit can be in its short mode when the top and bottom units are in their long mode. In this example, the middle unit contracts when the device switches from the short mode to the long mode, but this reduction in length contributes in a combinatory way to an increase in overall length of the device.

In this way, in a first mode shown in FIG. 3(a), the top and bottom electroactive polymer units 22, 24 are driven off (in their short mode) and the middle electroactive polymer unit 26 is driven on (in its long mode). Note that alternative designs may be driven on to their short mode and off to their long mode.

In a second mode shown in FIG. 3(b), the top and bottom electroactive polymer units 22, 24 are driven on (in their long mode) and the middle electroactive polymer unit is driven off (in its short mode).

In this design, in the first mode, the three electroactive polymer units have the same length. Thus, they have dissimilar inherent lengths (i.e. when all are turned off).

It can be assumed that the displacement D of an individual unit follows the relationship:

$$D = L \times \varepsilon$$

where L is the at rest length and c is the (engineering) strain.

This design thus makes use of a multi-body stack of EAP units with alternating mechanical connections in combination with an alternating on-off driving signal. If the driving signal is not alternated the multi-body stack has the same displacement as a single actuator. By alternating the driving signals of the single actuators the total tip displacement is multiplied by the number of actuators.

In a preferred embodiment, the length of the shorter actuator when extended (V=on) is equal to the length L of the longer actuator when in its non-extended mode (V=off). Therefore the length of the shorter EAP unit 26 when non-extended is $L \times (1/(1+\varepsilon))$.

In this manner, the stack displays the smallest external dimension (L) and the maximum possible forward displacement.

A controller is used to drive the actuator segments in an alternating way to have a maximum (static or reciprocating) tip movement. By varying the number of activated segments the tip displacement can be varied incrementally between zero and the maximum displacement.

The structure of FIG. 3 which has n=3 electroactive polymer units gives a displacement difference between FIG. 3(a) and FIG. 3(b) of:

$$D = L \times \varepsilon \times ((1/1+\varepsilon) + 2)$$

For small $\varepsilon$, this approximates $D = L \times \varepsilon \times 3$.

The effective length as defined above of the design of FIG. 3 is thus 3L, where L is the at rest length of the units 22, 24 but the at rest length of the unit 26 is $L/(1+\varepsilon)$.

More generally, for a stack of n layers (where n is an odd number, so that there are (n−1)/2 middle units and 1+(n−1)/2 top/bottom units):

$$D = L \times \varepsilon \times (((n-1)/2 \times (1/1+\varepsilon)) + ((n-1)/2) + 1)$$

The effective length as defined above is simply nL.

For small $\varepsilon$, this approximates $D = L \times \varepsilon \times n$.

The number of EAP units in the stack can be chosen based on the displacement needed. Thus, the design may have 3, 5, 7 or 9 units, or indeed any odd number of units. A slightly different design may have an even number of units greater than 3, in which case the actuation tip is at the same end of the device as the fixed connection.

Note that each individual EAP unit may comprise a multi-layer structure.

If the tip needs to provide an actuation force, a means for clamping the stack in the z-direction (i.e. the stacking direction) may be used, to prevent the stack buckling. This can be implemented by adding a downwards clamping force at the top and coating the surfaces of the actuators with very low friction material or adding an adhesive material between the stack layers with very low shear modulus but high tensile modulus in z-direction. This may for example comprise an array of thin vertical wires.

Figure 4:
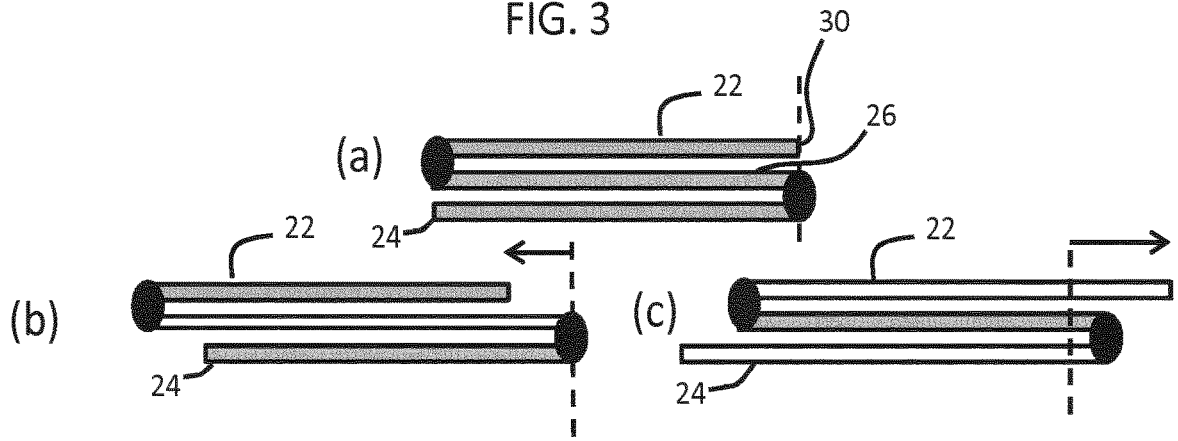
FIG. 4 shows a second example of EAP actuator device in three different modes.

FIG. 4 shows a second example of EAP actuator device in three different modes.

In the example of FIG. 3, the electroactive polymer units have different lengths. In FIG. 4(a), there is shown a third mode in which the top, middle and bottom electroactive polymer units are all driven off. This may be considered to be a third mode, and it is a rest mode for the electroactive polymer units. In this mode, the three electroactive polymer units have the same effective length. Thus, they have the same inherent lengths and can all be of the same design. The actuator tip 30 is at the non-coupled end of the top unit 22, and the non-coupled end of the bottom unit 24 is fixed.

FIG. 4(b) shows a first mode (similar to FIG. 3(a)) in which the middle unit is actuated and thus expanded. The actuator tip 30 moves to one side relative to its previous position.

FIG. 4(c) shows a second mode (similar to FIG. 3(b)) in which the top and bottom units are actuated and thus expanded. The actuator tip 30 moves to the other side relative to its previous position.

In this case, the actuation is to both sides of the device. Thus, the first and second modes provide actuation to opposite sides with respect to the rest position of the third mode of operation.

This example thus provides a multi-body stack having EAP actuators with alternating mechanical connections in combination with separate driving signals per EAP unit. In this case, the amplitude of the displacement that can be reached is more than for FIG. 3 but not in one direction only. The use of units of similar lengths is advantageous for manufacturing and resonance driving.

In particular, units of similar inherent length have similar resonance frequencies.

The tip displacement varies between:

$$D=-(n-1)/2 \times \varepsilon \times L; \text{ and}$$

$$D=((n-1)/2+1) \times \varepsilon \times L$$

Thus, the total range is equal to $n \times \varepsilon \times L$.

Figure 5:
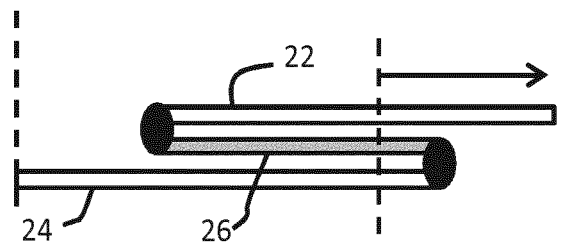
FIG. 5 shows a third example of EAP actuator device.

FIG. 5 shows a third example of EAP actuator device. In this design, the intermediate unit 26 is a rigid part. The stack then comprises two overlapping electroactive polymer units 22, 24 and a rigid connection piece between them. This design enables all of the electroactive polymer units to be driven in the same way, so simplifies the drive scheme and the electrode arrangement.

The device is again operable in at least first and second modes. In a first mode, the two electroactive polymer units are driven off. In a second mode shown in FIG. 5, the two electroactive polymer units are driven on.

The stack thus has alternating layers of EAP units 22, 24 and a stiff passive material 26. The end of the first (upper) EAP unit 22 is connected to one end of the passive layer. This layer is connected to the second (lower) EAP unit at the other end, creating a net displacement proportional to $n \times \varepsilon \times L$ where n is the number of EAP layers only.

Alternatively, the displacement may be expressed as:

$$D=((n-1)/2+1) \times \varepsilon \times L, \text{ where } n \text{ is the total number of layers including EAP units and passive layers.}$$

In a preferred embodiment, the length of the passive material is equal to the length of the longest actuator when in its non-extended mode (no voltage applied). In this manner, the stack displays the smallest external dimension (L) and the maximum possible displacement.

The EAP units are again driven in an alternating way to have a maximum (static or reciprocating) tip movement. By varying the number of activated segments the tip displacement can be varied incrementally between zero and the maximum displacement.

This example makes the driving scheme more simple, for example with only two wires, and allows for thin film electronics in embedded each passive layer.

All of the designs above may be extended to more layers, with either an odd or even number of units, as explained above.

In all of these stack designs, the layers of the stack may comprise a single folded layer, with segmented electrodes to define the different electroactive polymer units.

Figure 6:
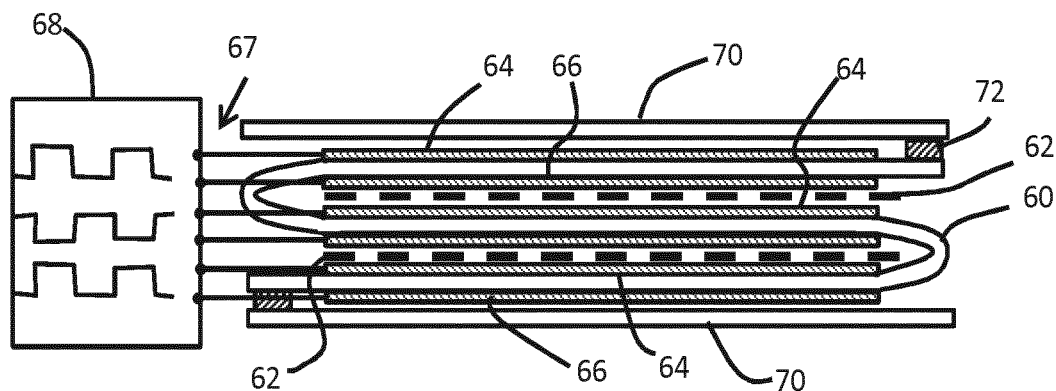
FIG. 6 shows a fourth example of EAP actuator device.

FIG. 6 shows a single folded EAP sheet with segmented electrodes, and non-electrode areas located at the bends.

The single folded sheet 60 defines all three EAP units. If no electrodes are provided in the middle unit, it may be a static layer as in the example of FIG. 5. Between adjacent layers in the stack, there is a low friction interface 62. This may function as a clamp arrangement for clamping the stack in the stacking direction to prevent bucking. The low friction enables relative sliding. The interface 62 may also provide electric shielding between the different electrode arrangements.

Each driven unit in the stack has a top electrode 64 and a bottom electrode 66. In FIG. 6, all three units are driven, so there are six electrode lines 67, and drive signals are applied between each pair. FIG. 6 schematically shows a drive unit 68 for delivering the required drive signals to the electrode lines 67. As shown in FIG. 6, when the top and bottom electrode pairs have a zero signal, the middle pair has a high voltage, and when the top and bottom electrode pairs have a high voltage signal, the middle pair is at zero.

The bends in the sheet 60 have no metallization.

The top and bottom outer surface have further sheets 70 to prevent buckling.

One end of the device functions as the movable tip, and there is a tip interface 72 for interfacing with a device to be actuated. The tip interface is connected to the end of the sheet 60 and also to the top anti-buckling layer 70. The other end of the sheet is attached to the bottom anti-buckling layer by glue 74 and this defines a static point for the design of FIG. 6.

The electroactive polymer units are planar in the design above, and the effective length is along a direction within the plane.

The examples above make use of a three-layer stack. More layers may be added to the stack to increase the displacement. However, a more simple structure (not within the scope of the invention as claimed) may also make use of a two layer stack without intermediate layer. In a first mode, the bottom actuatable polymer layer is driven off and the top actuatable polymer layer is driven on; whereas in a second mode the bottom polymer layer is driven on and the top polymer is driven off By having one end of the top polymer layer externally fixed, and the other end of the top polymer layer attached to the bottom polymer layer, the free end of the bottom polymer becomes the actuator tip. It moves each side of the external fixation by the expansion amount, depending which polymer layer is actuated.

Thus, the intermediate layer is not needed for all possible examples of device. The advantage it provides is that the actuator tip can be positioned remotely from the external fixation.

In a further set of examples, the electroactive polymer arrangement is coiled, and the outer tip of the coil comprises the actuation tip. This provides an alternative way to reduce the linear size of the electroactive polymer arrangement while maintaining an effective length larger than that linear size.

Figure 7:
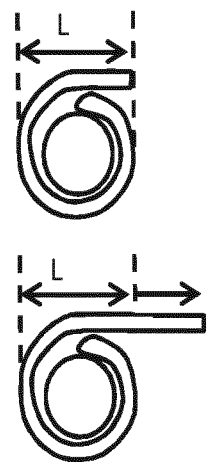
FIG. 7 shows a fifth example of EAP actuator device in two different modes.

FIG. 7 shows a first coiled design. The maximum external dimension of the unit is the outer diameter, shown as L. The coil is fixed in the center. When the coil is actuated, the free end moves. In FIG. 7, the free end moves in a straight line.

Figure 8:
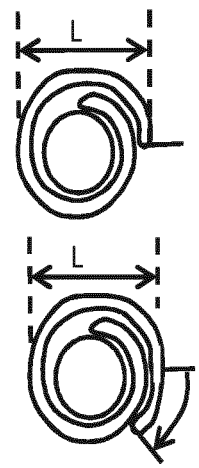
FIG. 8 shows a sixth example of EAP actuator device in two different modes.

FIG. 8 shows a second coiled design. The maximum external dimension of the unit is again the outer diameter, shown as L. The coil is again fixed in the center. In FIG. 8, the free end moves in a curve.

To constrain the movement in the manner desired, an external guide rail arrangement is used.

In all examples, incremental tip displacement may be enabled by using a simple on-off driving scheme.

The individual units in the stack may for example have dimensions of 10 mm×10 mm×0.5 mm. A typical and non-limiting size range may be from 50 mm×50 mm×2 mm to 2 mm×2 mm×0.1 mm. The shape in plan view may be square, but it may instead be an elongate rectangle.

Materials suitable for the EAP layer are known. Electroactive polymers include, but are not limited to, the subclasses: piezoelectric polymers, electromechanical polymers, relaxor ferroelectric polymers, electrostrictive polymers, dielectric elastomers, liquid crystal elastomers, conjugated polymers, Ionic Polymer Metal Composites, ionic gels and polymer gels.

The sub-class electrostrictive polymers includes, but is not limited to:

Polyvinylidene fluoride (PVDF), Polyvinylidene fluoride-trifluoroethylene (PVDF-TrFE), Polyvinylidene fluoride-trifluoroethylene-chlorofluoroethylene (PVDF-TrFE-CFE), Polyvinylidene fluoride-trifluoroethylene-chlorotrifluoroethylene) (PVDF-TrFE-CTFE), Polyvinylidene fluoride-hexafluoropropylene (PVDF-HFP), polyurethanes or blends thereof.

The sub-class dielectric elastomers includes, but is not limited to:

acrylates, polyurethanes, silicones.

The sub-class conjugated polymers includes, but is not limited to:

polypyrrole, poly-3,4-ethylenedioxythiophene, poly(p-phenylene sulfide), polyanilines.

Additional passive layers may be provided for influencing the behavior of the EAP layer in response to an applied electric field.

The EAP layer of each unit may be sandwiched between electrodes. The electrodes may be stretchable so that they follow the deformation of the EAP material layer. Materials suitable for the electrodes are also known, and may for example be selected from the group consisting of thin metal films, such as gold, copper, or aluminum or organic conductors such as carbon black, carbon nanotubes, graphene, poly-aniline (PANI), poly(3,4-ethylenedioxythiophene) (PEDOT), e.g. poly(3,4-ethylenedioxythiophene) poly(styrenesulfonate) (PEDOT:PSS). Metalized polyester films may also be used, such as metalized polyethylene terephthalate (PET), for example using an aluminum coating.

The materials for the different layers will be selected for example taking account of the elastic moduli (Young's moduli) of the different layers.

Additional layers to those discussed above may be used to adapt the electrical or mechanical behavior of the device, such as additional polymer layers.

The EAP devices may be electric field driven devices or ionic devices. Ionic devices may be based on ionic polymer-metal composites (IPMCs) or conjugated polymers. An ionic polymer-metal composite (IPMC) is a synthetic composite nanomaterial that displays artificial muscle behavior under an applied voltage or electric field.

IPMCs are composed of an ionic polymer like Nafion or Flemion whose surfaces are chemically plated or physically coated with conductors such as platinum or gold, or carbon-based electrodes. Under an applied voltage, ion migration and redistribution due to the imposed voltage across a strip of IPMCs result in a bending deformation. The polymer is a solvent swollen ion-exchange polymer membrane. The field causes cations travel to cathode side together with water. This leads to reorganization of hydrophilic clusters and to polymer expansion. Strain in the cathode area leads to stress in rest of the polymer matrix resulting in bending towards the anode. Reversing the applied voltage inverts the bending.

If the plated electrodes are arranged in a non-symmetric configuration, the imposed voltage can induce all kinds of deformations such as twisting, rolling, torsioning, turning, and non-symmetric bending deformation.

As mentioned above, the mechanical designs explained above may also be applied to photoactive materials. Such photo-mechanically responsive materials for example consist of photo-mechanically responsive molecules embedded in a polymer matrix. The photo-mechanically responsive molecules change shape as a function of an applied illumination with light of a certain wavelength.

The most common photo-mechanical materials are driven by a shape change between two isomeric states in the photoresponsive molecules present in the material. The switch between the trans configuration is driven by illuminating with light corresponding to the absorption wavelength of the molecule in the trans state while the switch back to the metastable cis form can be thermally induced or once again triggered by illuminating with light of a wavelength which corresponds to the absorption wavelength of the molecule in its cis state.

Such materials include but not limited to anthracenes, diarylethenes, spiropyrans and azobenzenes, including substituted azobenzenes such as aminoazobenzenes and pseudostilbenes. These photo-mechanically responsive molecules are embedded in a polymer material, either via doping of host polymers with such functional photo-mechanically responsive molecules or via covalently bonded molecules with photo-mechanical functionality in the polymer via polymerization. This includes polymerization of azofunctionalized monomers or post-functionalization of polymers with a different backbone, creating side-chain azofunctionalized polymers.

Polymers can be amorphous or liquid crystalline (LC) in nature. Where amorphous polymers contract equally in all directions, LC polymers can be made to deform in a preferential direction, greatly increasing the effect in that direction. Liquid crystal elastomers (LCE's) are especially suitable materials for photo mechanical materials, since they can have LC induced directionality in an all solid state polymer material.

This invention is of particular interest for actuators which are designed to have an in plane linear expansion response. Some types of material (for example ionic EAPs have a bending response or an in-plane expansion response depending how they are driven or constrained. Thus ionic EAPs and photo actuated materials may be configured to provide the desired in plane expansion, for example by actuating from both opposite sides of a layer of material.

The invention can be applied in many EAP and photoactive polymer applications, including examples where a passive matrix array of actuators is of interest.

In many applications the main function of the product relies on the (local) manipulation of human tissue, or the actuation of tissue contacting interfaces. In such applications EAP actuators for example provide unique benefits mainly because of the small form factor, the flexibility and the high energy density. Hence EAP's and photoactive polymers can be easily integrated in soft, 3D-shaped and/or miniature products and interfaces. Examples of such applications are:

Skin cosmetic treatments such as skin actuation devices in the form of a responsive polymer based skin patches which apply a constant or cyclic stretch to the skin in order to tension the skin or to reduce wrinkles;

Respiratory devices with a patient interface mask which has a responsive polymer-based active cushion or seal, to provide an alternating normal pressure to the skin which reduces or prevents facial red marks;

Electric shavers with an adaptive shaving head. The height of the skin contacting surfaces can be adjusted using responsive polymer actuators in order to influence the balance between closeness and irritation;

Oral cleaning devices such as an air floss with a dynamic nozzle actuator to improve the reach of the spray, especially in the spaces between the teeth. Alternatively, toothbrushes may be provided with activated tufts;

Consumer electronics devices or touch panels which provide local haptic feedback via an array of responsive polymer transducers which is integrated in or near the user interface;

Catheters with a steerable tip to enable easy navigation in tortuous blood vessels.

Another category of relevant application which benefits from such actuators relates to the modification of light. Optical elements such as lenses, reflective surfaces, gratings etc. can be made adaptive by shape or position adaptation using these actuators. Here one benefit of EAPs for example is a lower power consumption.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. An actuator device comprising:
   a stack of at least a first and a second polymer units connected by an intermediate layer,
      wherein the first polymer unit has a first end and a second end, wherein the second end is opposite the first end,
      wherein the second polymer unit has a first end and a second end, wherein the second end is opposite the first end,
      wherein the intermediate layer has a first end and a second end, wherein the first end is opposite the second end,
      wherein the first end of the first polymer unit is connected to the first end of the intermediate layer, and the second end of the second polymer unit is connected to the second end of the intermediate layer, and
      wherein the intermediate layer comprises at least a third polymer unit; and
   a drive unit,
      wherein the drive unit is arranged to operate in at least a first, a second, and a third modes,
      wherein in the first mode, the first polymer unit and the second polymer unit are driven off and the third polymer unit is driven on,
      wherein in the second mode, the first and the second polymer units are driven on and the third polymer unit is driven off, and
      wherein in the third mode, the first, second and third polymer units are driven off, and the first, second, and third polymer units have the same length.

2. The actuator device as claimed in claim 1, further comprising:
   a fixed end at the first end of the second polymer unit; and
   a free end at the second end of the first polymer unit.

3. The actuator device as claimed in claim 2,
   wherein the free end has a rest position in the third mode,
   wherein the free end is displaced in a first direction in the first mode, and
   wherein the free end is displaced in a second direction in the second mode.

4. The actuator device as claimed in claim 1,
   wherein the layers of the stack comprise a single folded layer.

5. The actuator device as claimed in claim 1, wherein the polymer units are arranged within a plane.

6. The actuator device as claimed in claim 1, further comprising a clamp arrangement for clamping the stack in the stacking direction.

7. The actuator device as claimed in claim 1, wherein each polymer unit comprises an electroactive polymer and actuation comprises electrical driving.

8. The actuator device as claimed in claim 1, wherein at least a portion of the first polymer unit overlaps at least a portion of the second polymer unit.

9. The actuator device as claimed in claim 1, wherein each of the first second, and third polymer units is electroactive.

10. The actuator device as claimed in claim 1, wherein each of the first second, and third polymer units is photoactive.

11. The actuator device as claimed in claim 3, wherein the first direction is opposite the second direction.

12. The actuator device as claimed in claim 4, wherein a plurality of segmented electrodes are arranged to define the first, second, and third polymer units.

13. The actuator device as claimed in claim 5, wherein an effective length of the actuator device is along a direction within the plane.

14. The actuator device as claimed in claim 6, wherein the clamp arrangement is arranged to prevent bucking.

15. The actuator device as claimed in claim 1, wherein each polymer unit comprises a photoactive polymer and actuation comprises optical driving.

16. An actuator device comprising:
   a first polymer unit, the first polymer unit comprising a first end and a second end;
   a second polymer unit, the second polymer unit comprising a third end and a fourth end;
   an intermediate layer, the intermediate layer comprising a fifth end a sixth end,
      wherein the first end is connected to the fifth end,
      wherein the fourth end is connected to sixth end, and
      wherein the intermediate layer comprises at least a third polymer unit; and
   a drive unit,
      wherein the drive unit is arranged to operate in at least a first mode, a second mode, and a third mode,
      wherein, in the first mode, the first polymer unit and the second polymer unit are driven off and the third polymer unit is driven on, wherein, in the second mode, the first polymer unit and the second polymer unit are driven on and the third polymer unit is driven off, and wherein in the third mode, the first polymer unit, the second polymer unit, and the third polymer unit are driven off, and the first polymer unit, the second polymer unit and the third polymer unit have the same length.

17. The actuator device as claimed in claim 16, wherein the first end is aligned with the third end.

18. The actuator device as claimed in claim 16, wherein each polymer unit comprises an electroactive polymer and actuation comprises electrical driving.

19. The actuator device as claimed in claim 16, wherein each polymer unit comprises a photoactive polymer and actuation comprises optical driving.

20. The actuator device as claimed in claim 16, wherein at least a portion of the first polymer unit overlaps at least a portion of the second polymer unit.

* * * * *